US007456713B2

(12) United States Patent
Park et al.

(10) Patent No.: US 7,456,713 B2
(45) Date of Patent: Nov. 25, 2008

(54) RF MEMS SWITCH AND FABRICATION METHOD THEREOF

(75) Inventors: Jae-Yeong Park, Seoul (KR); Hee-Chul Lee, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 11/646,293

(22) Filed: Dec. 28, 2006

(65) Prior Publication Data

US 2007/0109081 A1    May 17, 2007

Related U.S. Application Data

(60) Continuation of application No. 11/640,198, filed on Dec. 18, 2006, which is a division of application No. 11/036,039, filed on Jan. 18, 2005, now Pat. No. 7,151,425.

(30) Foreign Application Priority Data

Jan. 19, 2004    (KR)    ................................ 2004-03972

(51) Int. Cl.
*H01P 1/10*    (2006.01)
(52) U.S. Cl. ...................... 333/262; 333/105
(58) Field of Classification Search ................. 333/101, 333/105, 262; 200/181
See application file for complete search history.

(56) References Cited

U.S. PATENT DOCUMENTS

| | | | |
|---|---|---|---|
| 6,426,687 B1 | 7/2002 | Osborn | |
| 6,621,387 B1* | 9/2003 | Hopcroft | .................... 333/262 |
| 6,713,695 B2* | 3/2004 | Kawai et al. | ................ 200/181 |
| 6,750,742 B2* | 6/2004 | Kang et al. | ................. 333/262 |
| 6,909,346 B1* | 6/2005 | Kornrumpf | ................. 333/262 |
| 7,098,577 B2* | 8/2006 | Mehta | ........................ 310/332 |

* cited by examiner

*Primary Examiner*—Dean O Takaoka
(74) *Attorney, Agent, or Firm*—Birch, Stewart, Kolasch & Birch, LLP

(57) ABSTRACT

Disclosed are an RF MEMS switch and a fabrication method thereof. According to an embodiment the RF MEMS switch is actuated with a low voltage and a low consumption power by using a piezoelectric capacitor actuated by being converted to mechanical energy from electric energy when an electric field is applied to the piezoelectric capacitor. A cap substrate can be formed by using an etching method, a chemical mechanical polishing method, an electroplating method, etc., and the RF MEMS switch has a high reliability and a high yield.

62 Claims, 18 Drawing Sheets

RF MEMS SWITCH AND FABRICATION METHOD THEREOF

This application is a Continuation of application Ser. No. 11/640,198 filed on Dec. 18, 2006, which is a Divisional of application Ser. No. 11/036,039 filed on Jan. 18, 2005, now U.S. Pat. No. 7,151,425 issued on Dec. 19, 2006 and for which priority is claimed under 35 U.S.C. § 120. The present application also claims priority of Application No. 10-2004-0003972 filed in Republic of Korea on Jan. 19, 2004 under 35 U.S.C. § 119. The entire contents of all these applications are hereby incorporated by reference.

BACKGROUND OF THE INVENTION

1. Field of the Invention

The present invention relates to an RF MEMS switch and a fabrication method thereof, and more particularly, to an RF MEMS switch capable of controlling an RF signal by using a piezoelectric capacitor and a fabrication method thereof.

2. Description of the Conventional Art

As information communication develops recently, an information communication electronic system is required to be small, light, and actuated in a high function. According to this, miniature components which constitute the information communication electronic system are required to be developed. Among the miniature components, a radio frequency micro-electromechanical system (RF MEMS) switch for controlling a system signal is being widely used.

Currently, an FET switch or a semiconductor switch such as a PIN diode, etc. is being widely used as a switch of information communication system. However, the switches have many disadvantages such as a high power loss, a distortion, and a non-linear characteristic at the time of being actuated.

Also, the RF MEMS switch using an electrostatic force requires a high voltage and has a low reliability in operation.

SUMMARY OF THE INVENTION

Therefore, an object of the present invention is to provide an RF MEMS switch capable of being actuated with a low driving voltage and a low consumption power by using a piezoelectric capacitor and capable of obtaining a high yield and a high reliability, and a fabrication method thereof.

To achieve these and other advantages and in accordance with the purpose of the present invention, as embodied and broadly described herein, there is provided an RF MEMS switch comprising: a cap substrate having via holes at both sides thereof, the via hole provided with a connection line; a transmission line having a first transmission line and a second transmission line spaced from each other with a certain gap at a lower surface of the cap substrate; a ground line formed at both sides of the transmission line; a connection pad formed at an upper surface of the cap substrate, and electrically connected to the transmission line and the ground line by the connection line; a bottom substrate having a certain gap from the cap substrate; a piezoelectric capacitor formed at one side of a suspension layer formed at an upper surface of the bottom substrate, and actuated with a piezoelectric characteristic by receiving an external power; and a contact electrode formed at another side of the suspension layer and moved up and down by a displacement of the piezoelectric capacitor, for selectively turning on/off RF signals of the first signal transmission line and the second signal transmission line.

To achieve these and other advantages and in accordance with the purpose of the present invention, as embodied and broadly described herein, there is also provided a fabrication method of an RF MEMS switch comprising: sequentially forming a first suspension layer of a silicon nitride and a second suspension layer of a silicon oxide on an upper surface of a bottom substrate, and forming a piezoelectric capacitor composed of a first electrode layer, a piezoelectric layer, and a second electrode at one side of an upper surface of the second suspension layer; forming a contact electrode at another side of the upper surface of the second suspension layer; etching the first suspension layer and the second suspension layer of the rest region except the piezoelectric capacitor and the contact electrode; etching a part of the bottom substrate to release a gap between the first suspension layer and the bottom substrate, thereby completing the bottom substrate; etching a center part of a lower surface of a cap substrate to form a groove; forming via holes at both sides of the cap substrate and filling a metal in the via hole, thereby forming a connection line; forming a signal transmission line and a ground line at an upper surface of the cap substrate; forming a connection pad at the lower surface of the cap substrate; electrically connecting the signal transmission line and the ground line to the connection pad by the connection line, thereby completing the cap substrate; and bonding the cap substrate to the upper surface of the bottom substrate with a certain gap by using a bump.

According to a second embodiment of the present invention, there is provided an RF MEMS switch comprising: a cap substrate having via holes at both sides thereof, the via hole provided with a connection line; a signal transmission line formed at a lower surface of the cap substrate; a ground line formed at both sides of the signal transmission line; a connection pad corresponding to the signal transmission line and formed at an upper surface of the cap substrate so as to be electrically connected to the signal transmission line and the ground line by the connection line; a bottom substrate having a certain gap from the cap substrate; a piezoelectric capacitor formed at one side of a suspension layer formed at an upper surface of the bottom substrate with a first metal layer thereof being exposed, and actuated with a piezoelectric characteristic by receiving an external power; and a capacitor contact electrode formed at another side of the suspension layer and connected to the exposed first metal layer, for selectively turning on/off an RF signal of the signal transmission line by being moved up and down by a displacement of the piezoelectric capacitor.

According to a second embodiment of the present invention, there is also provided a fabrication method of an RF MEMS switch comprising: sequentially forming a first suspension layer of a silicon nitride and a second suspension layer of a silicon oxide on an upper surface of a bottom substrate, and forming a piezoelectric capacitor composed of a first electrode layer, a piezoelectric layer, and a second electrode at one side of an upper surface of the second suspension layer; patterning the second electrode layer and the piezoelectric layer and then etching so that a part of the first electrode layer can be exposed; forming a capacitor contact electrode at another side of the upper surface of the second suspension layer so that the exposed part of the first electrode layer can be covered; etching the first suspension layer and the second suspension layer of the rest region except the piezoelectric capacitor and the contact electrode; etching a part of the bottom substrate to release a gap between the first suspension layer and the bottom substrate, thereby completing the bottom substrate; etching a center part of a lower surface of a cap substrate to form a groove; forming via holes at both sides of the cap substrate and filling a metal in the via hole, thereby forming a connection line; forming a signal transmission line and a ground line at an upper surface of the cap substrate; forming a connection pad at the lower surface of the cap substrate; electrically connecting the signal transmission line and the ground line to the connection pad by the connection line, thereby completing the cap substrate; and bonding the cap substrate to the upper surface of the bottom substrate with a certain gap by using a bump.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, an RF MEMS switch and a fabrication method thereof according to the present invention will be explained. To this end, an operation of a piezoelectric capacitor that serves as a piezoelectric actuating unit using a piezoelectric power, and structures of a resistive type RF MEMS switch and a capacity type RF MEMS switch will be explained in brief.

Figure 1:
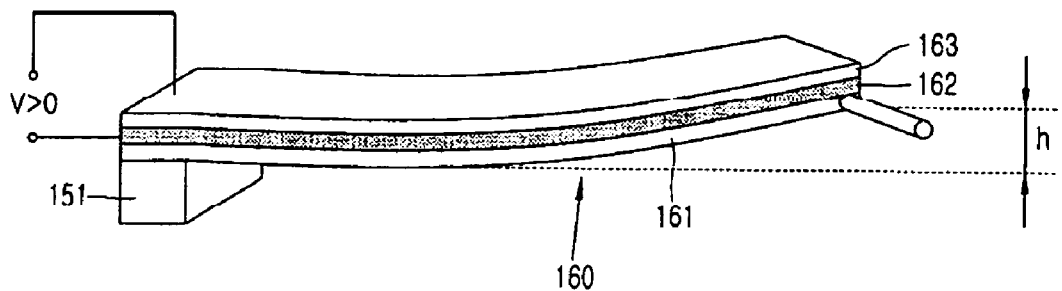
FIG. 1 is a perspective view showing an operation of a piezoelectric capacitor using a piezoelectric power.

FIG. 1 is a perspective view showing an operation of a piezoelectric capacitor using a piezoelectric power.

As shown, a piezoelectric capacitor 160 is formed on a suspension layer 151. The piezoelectric capacitor 160 has a structure that a piezoelectric body 162 is formed between an upper electrode 163 and a lower electrode 161.

When a power is applied to the upper electrode 163 and the lower electrode 161, the piezoelectric body 162 is contracted or expanded thereby to be displaced as much as "h" upwardly. The "h" is determined by a thickness ratio of the suspension layer 151 and a piezoelectric constant of the piezoelectric body 162. When PZT such as $Pb(Zr(Zr, Ti)O_3$ is used, power applied to the piezoelectric body 162 can be lowered, the piezoelectric body is smoothly actuated, and a fast switching speed can be obtained.

Figure 2:
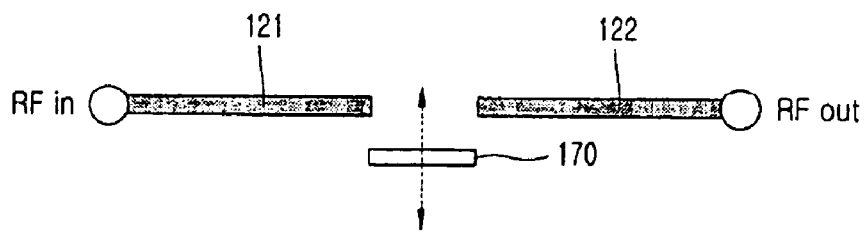
FIG. 2 is a schematic diagram showing a structure of a resistive type RF MEMS switch.
Figure 3:
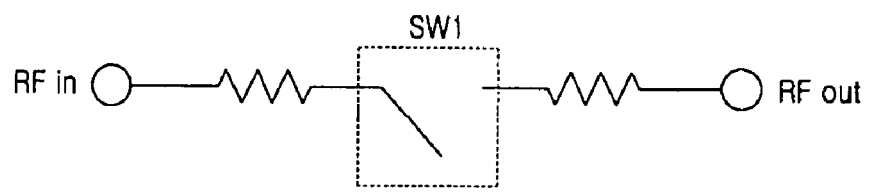
FIG. 3 is an equivalent circuit showing the structure of the resistive type RF MEMS switch.

FIG. 2 is a schematic diagram showing a structure of a resistive type RF MEMS switch, and FIG. 3 is an equivalent circuit showing the structure of the resistive type RF MEMS switch.

As shown, a contact electrode 170 is moved up and down by the displacement of the piezoelectric body 160, thereby turning on/off a first signal line 121 and a second signal line 122 spaced from each other with a certain gap. According to this, an RF signal flowing to the first signal line 121 and the second signal line 122 is controlled.

The first signal line 121 denotes an RF inline, and the second signal line 122 denotes an RF outline.

When the piezoelectric capacitor is operated, an RF signal is turned on and vice versa.

Figure 4:
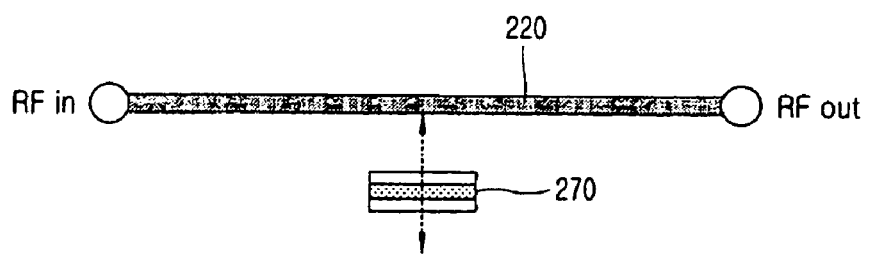
FIG. 4 is a construction view showing a capacity type RF MEMS switch.
Figure 5:
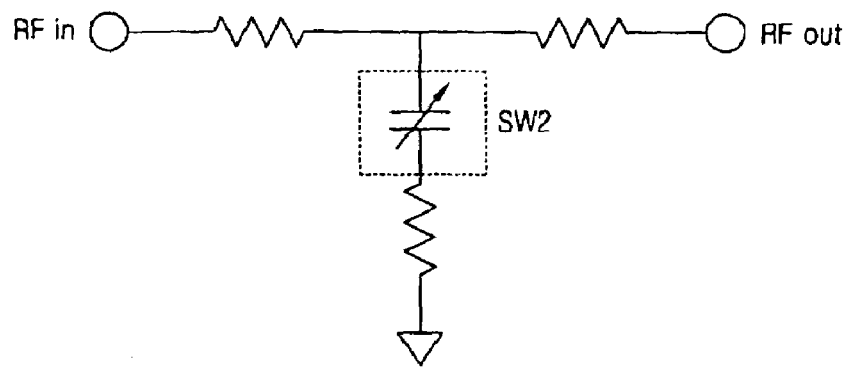
FIG. 5 is a circuit showing a structure of a resistive type RF MEMS switch.

FIG. 4 is a construction view showing a capacity type RF MEMS switch, and FIG. 5 is a circuit showing a structure of a resistive type RF MEMS switch.

As shown, a capacitor contact electrode 270 connected to the piezoelectric capacitor 160 and composed of a first metal layer, a dielectric layer, and a second metal layer is spaced from a signal transmission line 220 with a certain gap.

When a power is applied to the piezoelectric capacitor 160, the piezoelectric body 162 is contracted or expanded thereby to be displaced as much as "h" upwardly. At this time, the capacitor contact electrode 270 is moved and served as a variable capacitor. According to this, a capacitor is increased towards a ground line (not shown), thereby turning off an RF signal flowing to the signal transmission line 220. When the piezoelectric capacitor 160 is operated, an RF signal is turned off and vice versa.

In the RF MEMS switch and the fabrication method thereof according to the present invention, an RF signal can be fast and easily controlled by using a piezoelectric capacitor actuated as electric energy thereof is converted into mechanical energy when an electric field is applied thereto.

According to this, the RF MEMS switch of the present invention can be actuated with a voltage lower than 5V by using a piezoelectric power, and the RF MEMS switch can obtain a high reliability, a low voltage loss, and a fast switching speed.

Hereinafter, an RF MEMS switch and a fabrication method thereof according to the present invention will be explained with reference to the attached drawings.

Figure 6:
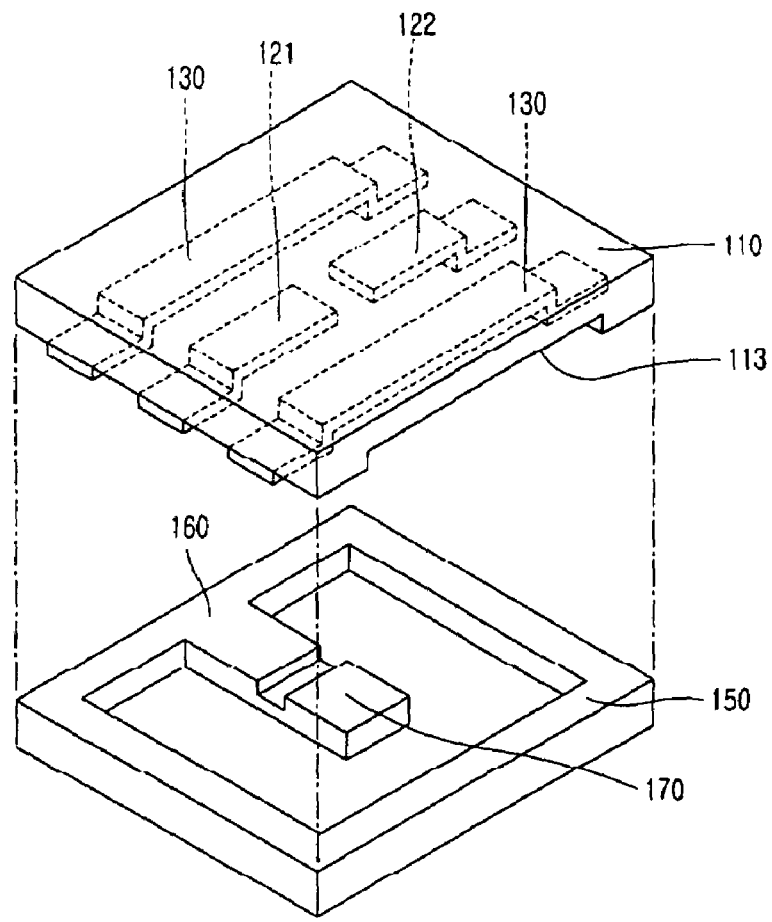
FIG. 6 is a perspective view showing an RF MEMS switch according to a first embodiment of the present invention.
Figure 7:
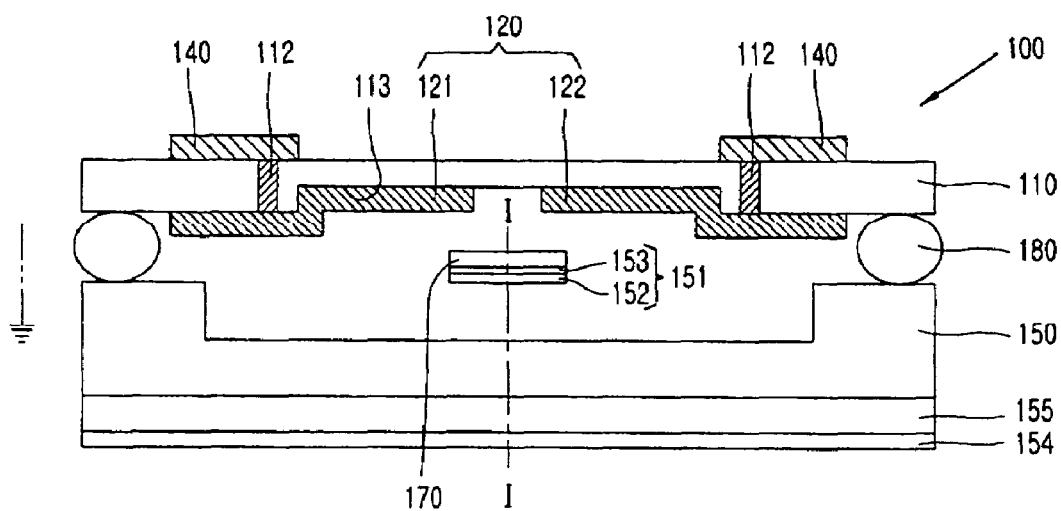
FIG. 7 is a longitudinal section view showing the RF MEMS switch according to the first embodiment of the present invention.
Figure 8:
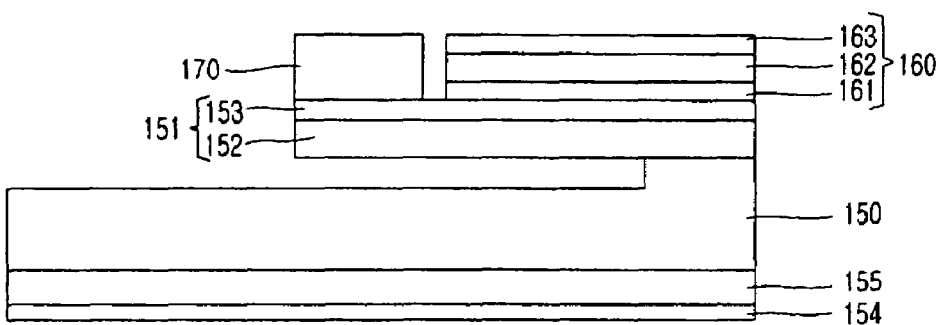
FIG. 8 is a longitudinal section view taken along line I-I of FIG. 7.
Figure 9:
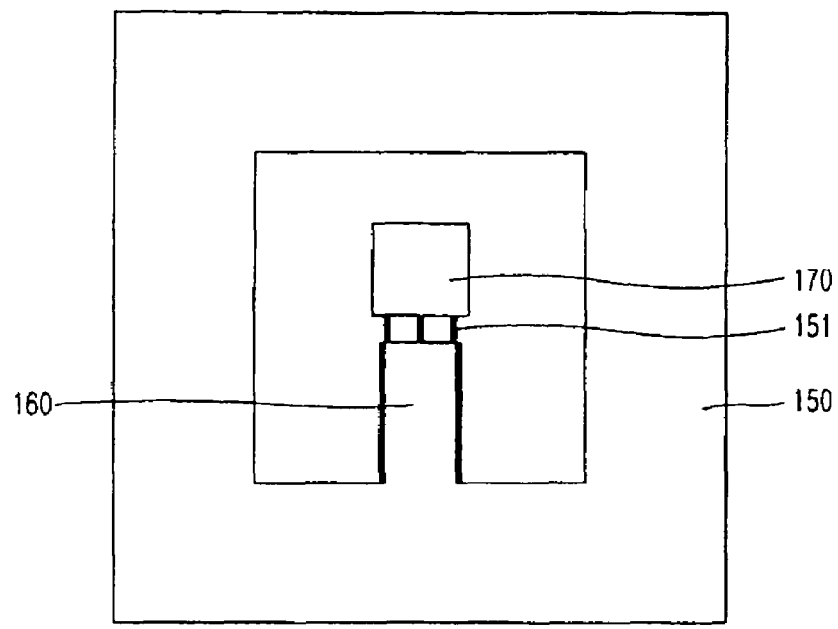
FIG. 9 is a plane view showing a bottom substrate of the RF MEMS switch according to the first embodiment of the present invention.

FIG. 6 is a perspective view showing an RF MEMS switch according to a first embodiment of the present invention, FIG. 7 is a longitudinal section view showing the RF MEMS switch according to the first embodiment of the present invention, FIG. 8 is a longitudinal section view taken along line I-I of FIG. 7, and FIG. 9 is a plane view showing a bottom substrate of the RF MEMS switch according to the first embodiment of the present invention.

As shown, an RF MEMS switch 100 according to the first embodiment of the present invention comprises: a cap substrate 110 having via holes 111 at both sides thereof, the via hole 111 provided with a connection line 112; a signal transmission line 120 formed at a lower surface of the cap substrate 110, and having a first signal transmission line 121 and a second signal transmission line 122 spaced from each other with a certain gap; a ground line 130 formed at both sides of the signal transmission line 120; a connection pad 140 formed at an upper surface of the cap substrate 110, and electrically connected to the signal transmission line 120 and the ground line 130 by the connection line 112; a bottom substrate 150 having a certain gap from the cap substrate 110; a piezoelectric capacitor 160 formed at one side of a suspension layer 151 formed at an upper surface of the bottom substrate 150, and actuated with a piezoelectric characteristic when an external power is applied thereto; and a contact electrode 170 formed at another side of the suspension layer 151, for selectively turning on/off RF signals of the first signal transmission line 121 and the second signal transmission line 122 by being moved up and down by a displacement of the piezoelectric capacitor 160.

The cap substrate 110 is formed as one signal transmission line 120 that connects an input terminal to an output terminal and two ground lines 130 are deposited on a silicon or a glass by a plating method.

A bump 180 is formed between the cap substrate 110 and the bottom substrate 150 in order to maintain a certain gap between the cap substrate 110 and the bottom substrate 150. As the bump 180, a solder bump or an organic bump can be used.

The contact electrode 170 has a basic structure of Ti/Au or Cr/Au for a low resistance and an excellent bonding with the suspension layer. In order to prevent a contact part between the contact electrode and the signal transmission line from being adhered to each other during an operation or in order to prevent a surface of the contact electrode from being damaged, Mo, W, and Ir for a high mechanical intensity and melting point can be thinly deposited.

That is, the contact electrode 170 preferably has one structure of Ti/Au/Mo, Cr/Au/Mo, Ti/Au/W, Cr/Au/W, Ti/Au/Ir, and Cr/Au/Ir.

The piezoelectric capacitor 160 is composed of a first metal layer 161, a piezoelectric layer 162, and a second metal layer 163. Preferably, the piezoelectric layer 162 is Pb(Zr, Ti) and a ratio between the Zr and Ti is 6:4.

Figure 10:
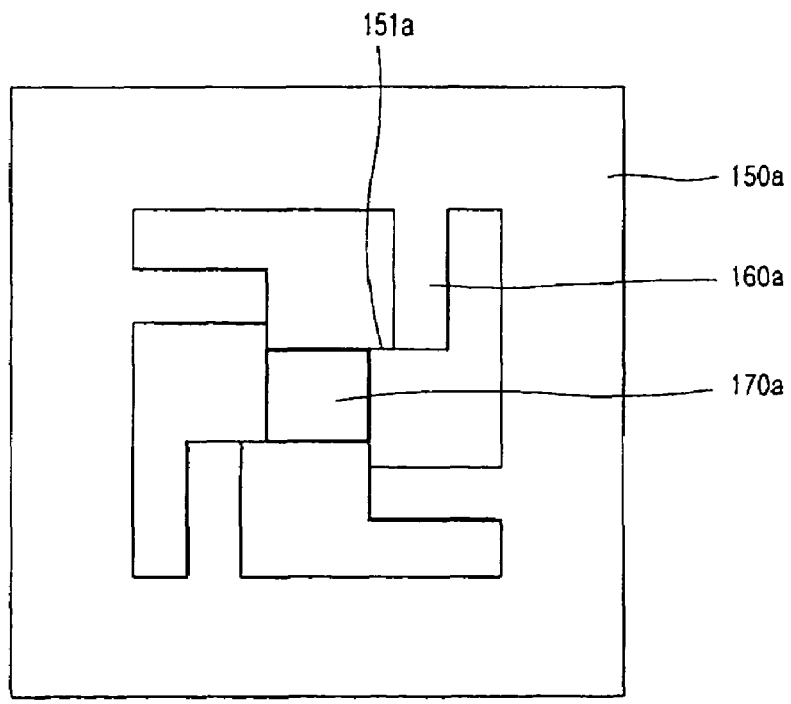
FIG. 10 is a plane view showing another example of the bottom substrate of the RF MEMS switch according to the first embodiment of the present invention.
Figure 11:
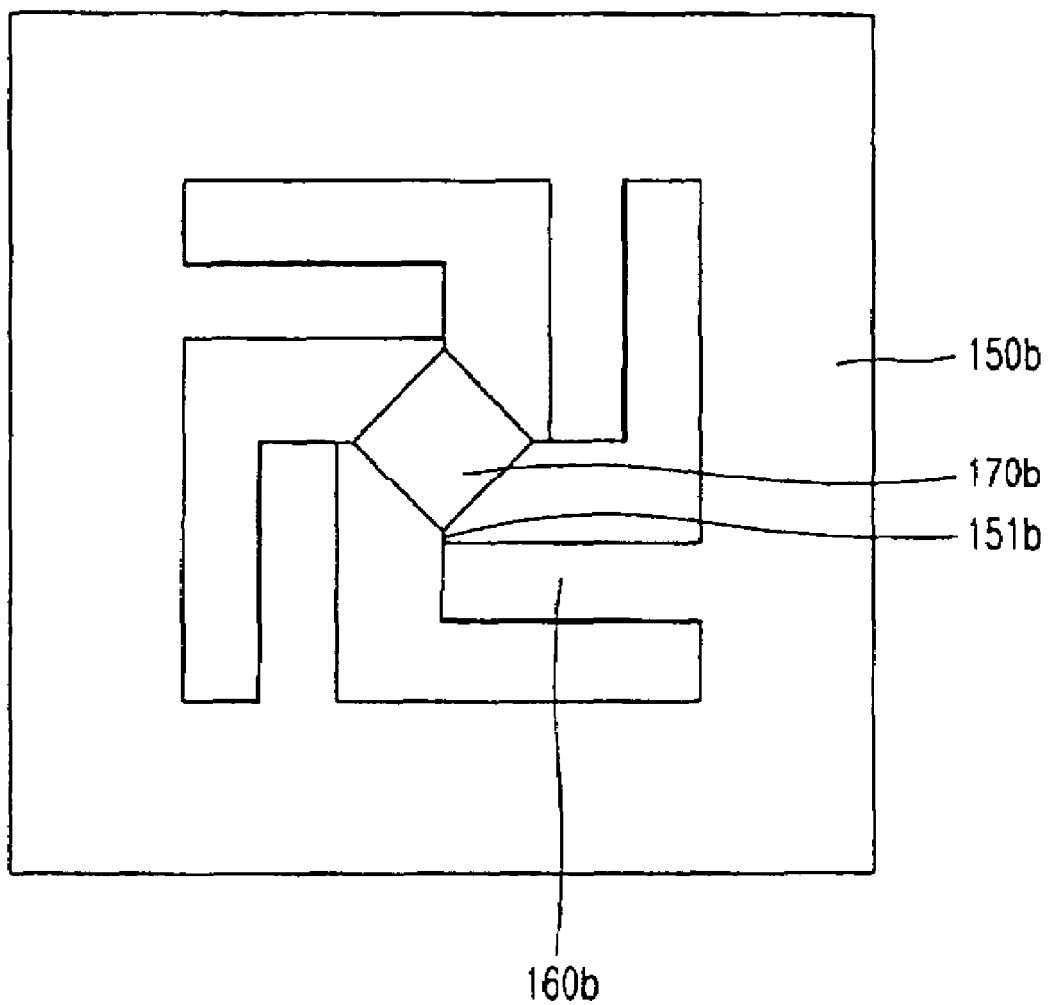
FIG. 11 is a plane view showing still another example of the bottom substrate of the RF MEMS switch according to the first embodiment of the present invention.

FIG. 10 is a plane view showing another example of the bottom substrate of the RF MEMS switch according to the first embodiment of the present invention, and FIG. 11 is a plane view showing still another example of the bottom substrate of the RF MEMS switch according to the first embodiment of the present invention.

As shown in FIG. 10, in a bottom substrate 150a, four piezoelectric cantilevers 151a support a square contact electrode 170a.

As shown in FIG. 11, in a bottom substrate 150b, four piezoelectric cantilevers 151b support a square contact electrode 170b.

As the contact electrodes 170a and 170b move in parallel with the bottom substrates 150a and 150b, a contact area between the aforementioned signal transmission line (not shown) and each contact electrode 170a and 170b becomes wider and thereby an RF signal can be more efficiently controlled.

In the RF MEMS switch 100 according to the first embodiment of the present invention, when power is supplied to the RF MEMS switch through the second metal layer 163, the suspension layer 151 that serves as a cantilever is deformed. At this time, the contact electrode 170 connects the first signal transmission line 121 and the second signal transmission line 122, thereby turning on the RF MEMS switch. On the contrary, when a power supply to the RF MEMS switch 100 is cut off, the deformed suspension layer 151 is restored to the original state, thereby turning off the RF MEMS switch.

FIGS. 12A to 12K are section views showing a fabrication process of an RF MEMS switch according to a first embodiment of the present invention.

A fabrication method of an RF MEMS switch according to a first embodiment of the present invention comprises: sequentially forming a first suspension layer of a silicon nitride and a second suspension layer of a silicon oxide on an upper surface of a bottom substrate, and forming a piezoelectric capacitor composed of a first electrode layer, a piezoelectric layer, and a second electrode at one side of an upper surface of the second suspension layer; forming a contact electrode at another side of the upper surface of the second suspension layer; etching the first suspension layer and the second suspension layer of the rest region except the piezoelectric capacitor and the contact electrode; etching a part of the bottom substrate to release a gap between the first suspension layer and the bottom substrate, thereby completing the bottom substrate; etching a center part of a lower surface of a cap substrate to form a groove; forming via holes at both sides of the cap substrate and filling a metal in the via hole, thereby forming a connection line; forming a signal transmission line and a ground line at an upper surface of the cap substrate; forming a connection pad at the lower surface of the cap substrate; electrically connecting the signal transmission line and the ground line to the connection pad by the connection line, thereby completing the cap substrate; and bonding the cap substrate to the upper surface of the bottom substrate with a certain gap by using a bump.

Figure 12A:
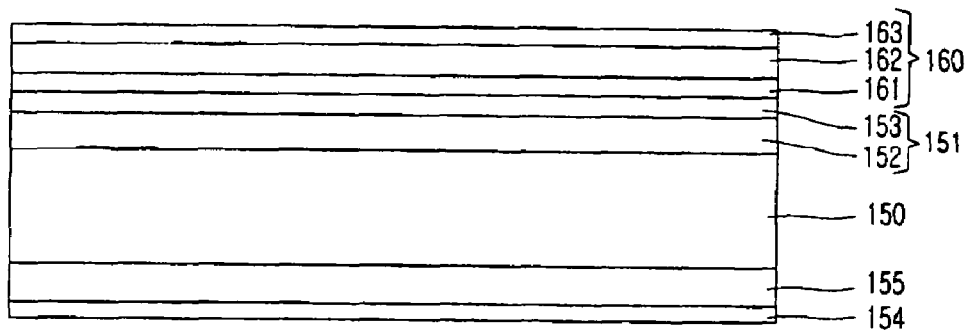
FIGS. 12A to 12K are section views showing a fabrication process of an RF MEMS switch according to a first embodiment of the present invention.

As shown in FIG. 12A, a first suspension layer 152 of a silicon nitride and a second suspension layer 153 of a silicon oxide are sequentially formed on an upper surface of a bottom substrate 150. Also, suspension layers 154 and 155 of a silicon nitride are formed on a lower surface of the bottom substrate 150. Then, a piezoelectric capacitor 160 composed of a first electrode layer 161, a piezoelectric layer 162, and a second electrode layer 163 is formed at one side of an upper surface of the second suspension layer 153. Preferably, the first suspension layer 152 and the second suspension layer 153 are deposited on the upper surface of the bottom substrate 150 by using a low pressure chemical vapor deposition method.

Figure 12B:
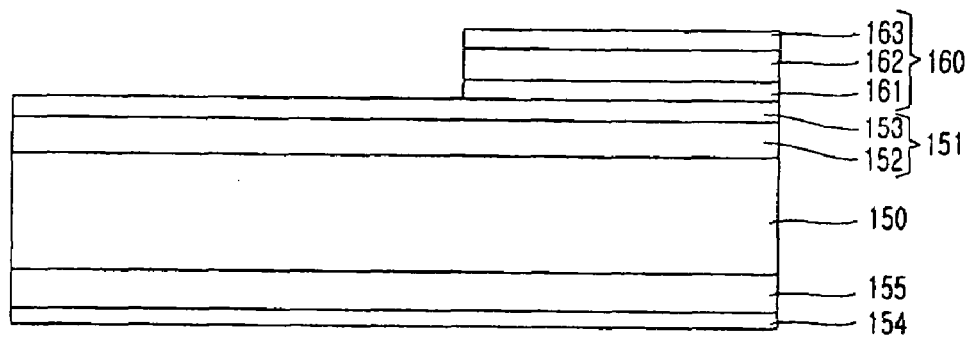

As shown in FIG. 12B, a part of the piezoelectric capacitor 160 is patterned and then etched, thereby removing unnecessary parts thereof.

Figure 12C:
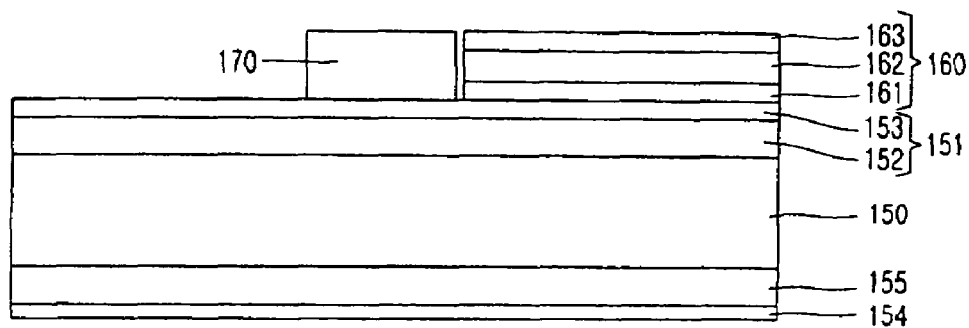

As shown in FIG. 12C, a contact electrode 170 is formed at another side of the upper surface of the second suspension layer 153.

Figure 12D:
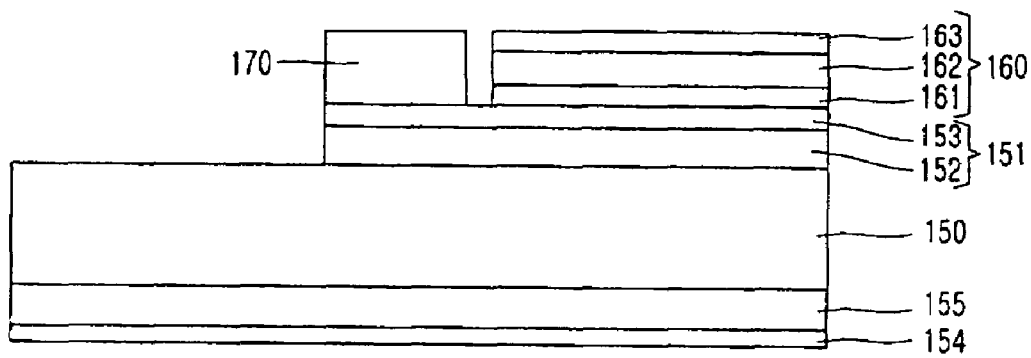

As shown in FIG. 12D, the first suspension layer 152 and the second suspension layer 153 of the rest region except the piezoelectric capacitor and the contact electrode are etched.

Figure 12E:
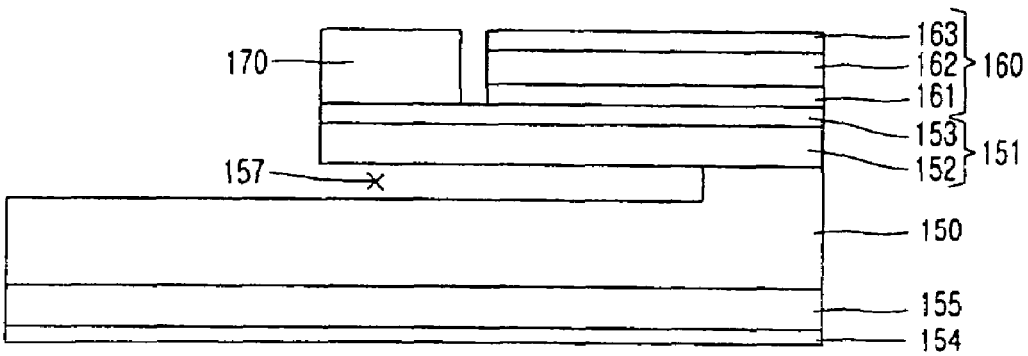

As shown in FIG. 12E, a part 157 of the bottom substrate 150 is etched to release a gap between the first suspension layer 152 and the bottom substrate 150, thereby completing the bottom substrate 150.

In the step for completing the bottom substrate, a wet etching is preferably performed by using one of KOH, hydrofluoric nitric acetic (HNA), tetra methyl ammonium hydroxide (TMAH), ethylene diamine pyrocatechol (EDP), and NaOH.

Figure 12F:

As shown in FIG. 12F, a center part of a lower surface of a mother substrate to be served as a cap substrate 110 is etched, thereby forming a groove 113.

Preferably, the groove of the cap substrate is formed by using one of a plasma dry etching method, a sand blaster, or a laser cutting method.

Figure 12G:
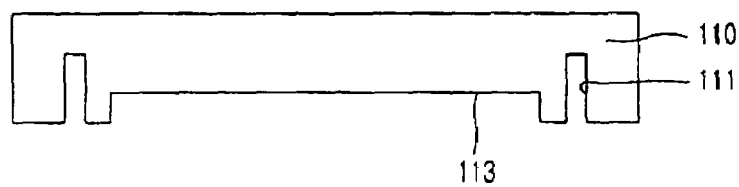
Figure 12H:
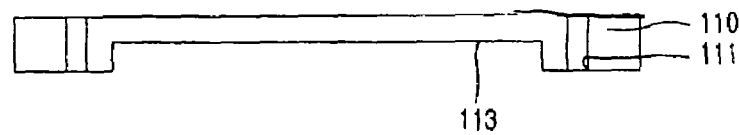
Figure 12I:
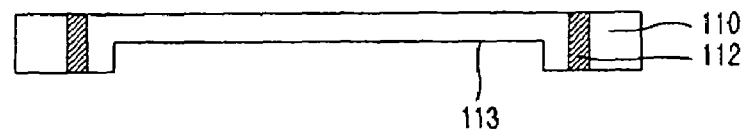

As shown in FIGS. 12G to 12I, a via hole 111 is formed at both sides of the cap substrate 110, and a rear surface of the cap substrate 110 is polished until the via hole 111 is exposed by using a chemical mechanical polishing method. Then, metal such as gold, copper, or silver is filled in the via hole 111 by using an electro-analysis or a metal paste, thereby forming a connection line 112.

Figure 12J:
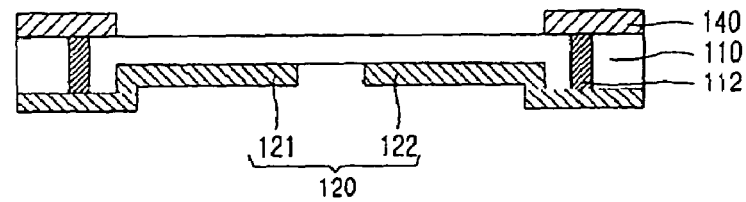

As shown in FIG. 12J, a signal transmission line 120, a ground line 130 (referring to FIG. 12K), and a connection pad 140 are sequentially patterned to be deposited on the lower surface of the cap substrate 110.

The signal transmission line 120 and the ground line 130 are electrically connected to the connection pad 140 by the connection line 112, thereby completing the cap substrate 110.

Figure 12K:
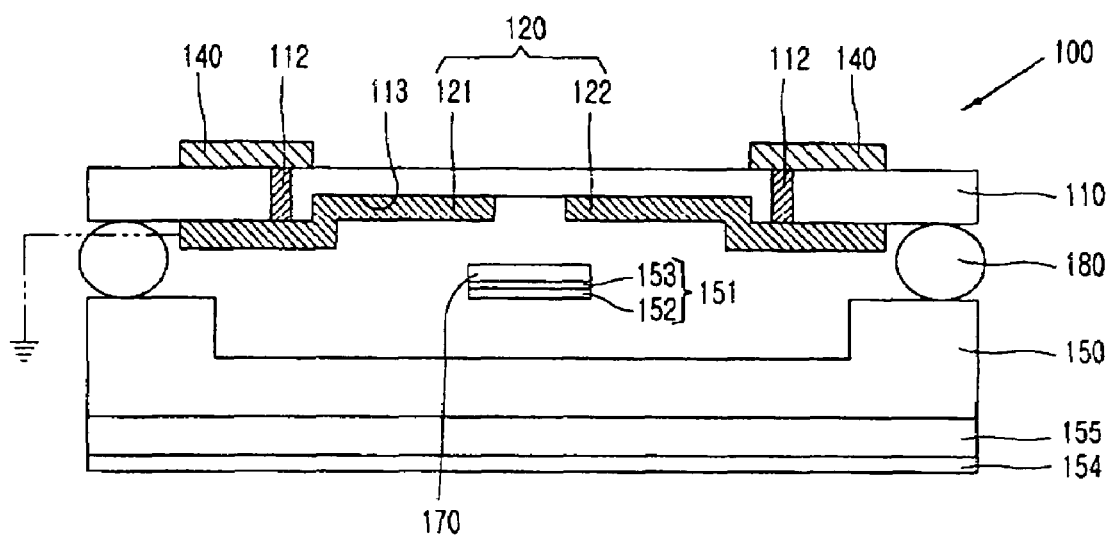

As shown in FIG. 12K, the cap substrate 110 is bonded to the upper surface of the bottom substrate 150 by using a bump 180, thereby completing the RF MEMS switch 100. Herein, the gap between the contact electrode and the signal transmission line approximately corresponds to a sum between the height of the bump and the height of the etched part of the cap substrate.

Although not shown, it is preferable that the ground line of the piezoelectric capacitor and the ground line of the cap substrate are independently constructed in order to control the gap between the signal transmission line and the contact electrode.

FIGS. 13A to 13F are section views showing a process for fabricating a cap substrate in the fabrication process of the MEMS switch according to the first embodiment of the present invention.

Figure 13A:
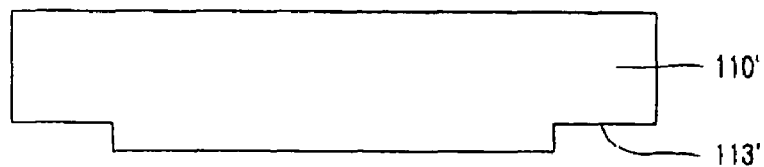
FIGS. 13A to 13F are section views showing a process for fabricating a cap substrate in the fabrication process of the MEMS switch according to the first embodiment of the present invention.

As shown in FIG. 13A, both parts of a lower surface of a mother substrate to be served as a cap substrate 110' are etched, thereby forming a groove 113'.

The groove 113' of the cap substrate 110' is formed by using one of a plasma dry etching method, a sand blaster, or a laser cutting method.

Figure 13B:
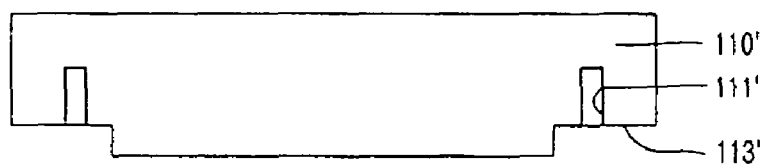
Figure 13C:
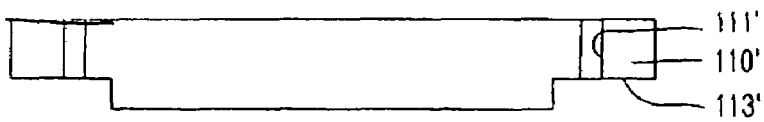
Figure 13D:

As shown in FIGS. 13B to 13D, a via hole 111' is formed at both sides of the cap substrate 110', and metal is filled in the via hole 111' thereby to form a connection line 112'. The lower surface of the cap substrate 110' is polished by using a chemical mechanical polishing method, thereby forming the via hole 111'.

Figure 13E:
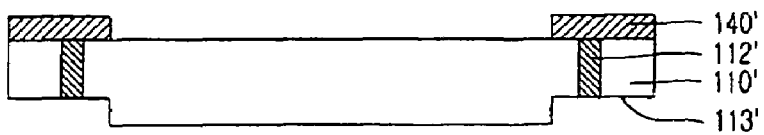
Figure 13F:
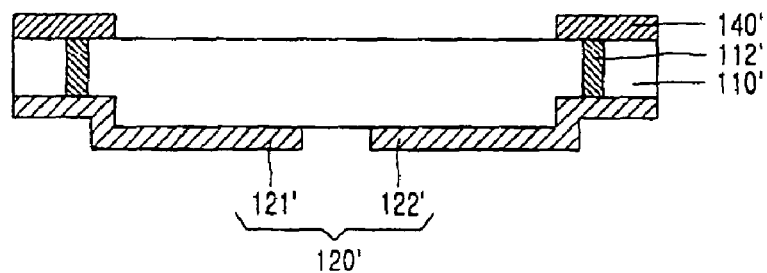

As shown in FIGS. 13E to 13F, a signal transmission line 120', a ground line 130', and a connection pad 140' are sequentially patterned to be deposited on a lower surface of the cap substrate 110'. Then, the signal transmission line 120' and the ground line 130' are electrically connected to the connection pad 140' by the connection line 112', thereby completing the cap substrate 110'.

In the above process, both sides of the lower surface of the cap substrate 110' are etched to form the groove 113' and thereby the center part of the cap substrate 110' is downwardly protruded. According to this, when the RF MEMS switch is completed, the gap between the contact electrode and the signal transmission line is minimized.

Figure 14:
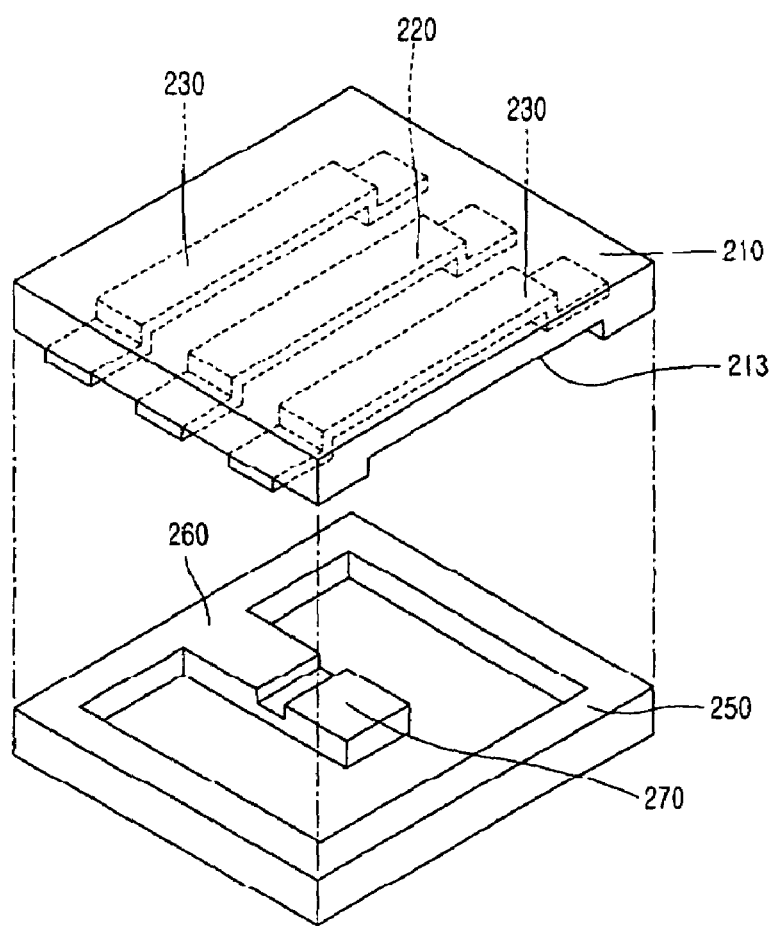
FIG. 14 is a perspective view showing an RF MEMS switch according to a second embodiment of the present invention.
Figure 15:
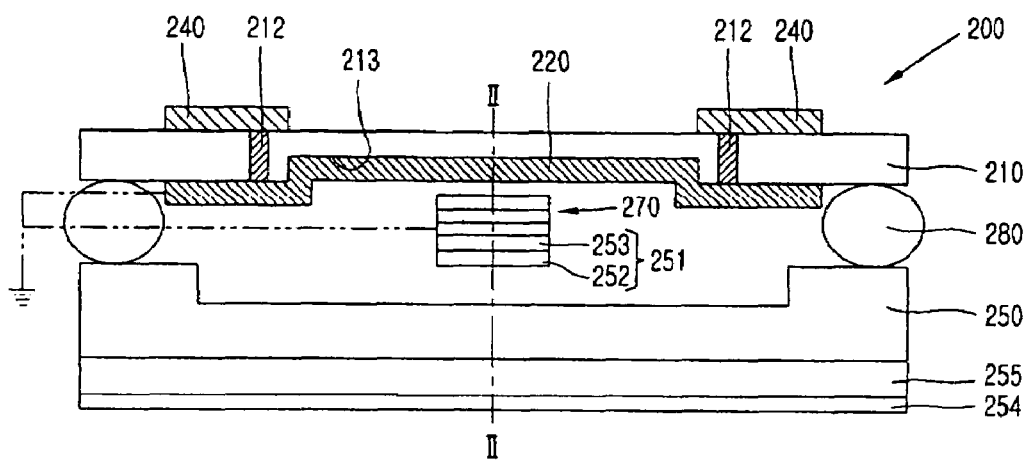
FIG. 15 is a longitudinal section view showing the RF MEMS switch according to the second embodiment of the present invention.
Figure 16:
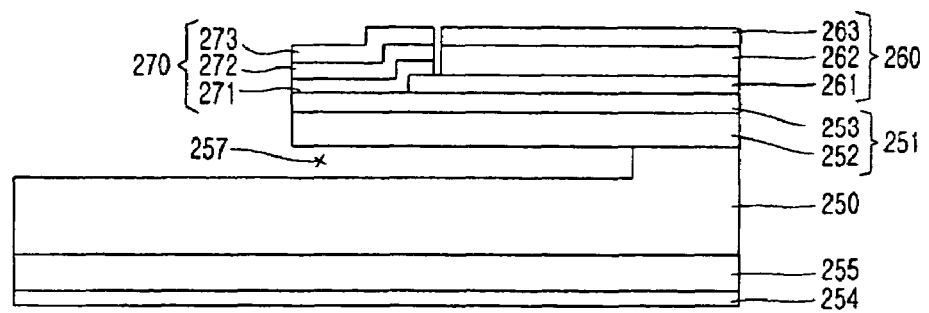
FIG. 16 is a longitudinal section view taken along line II-II of FIG. 15.
Figure 17:
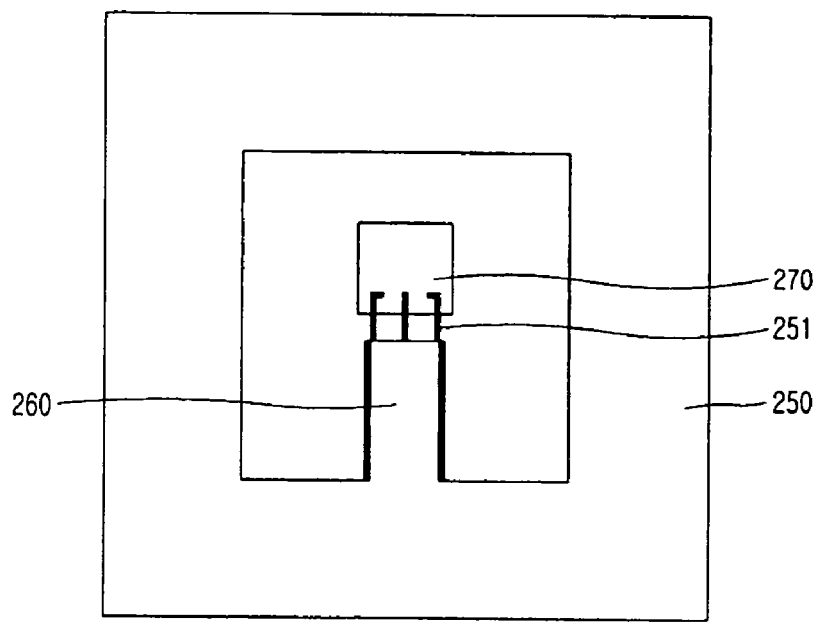
FIG. 17 is a plane view showing a bottom substrate in the RF MEMS switch according to the second embodiment of the present invention.

FIG. 14 is a perspective view showing an RF MEMS switch according to a second embodiment of the present invention, FIG. 15 is a longitudinal section view showing the RF MEMS switch according to the second embodiment of the present invention, FIG. 16 is a longitudinal section view taken along line II-II of FIG. 15, and FIG. 17 is a plane view showing a bottom substrate in the RF MEMS switch according to the second embodiment of the present invention.

As shown, an RF MEMS switch 200 according to the second embodiment of the present invention comprises: a cap substrate 210 having via holes 211 at both sides thereof, the via hole 211 provided with a connection line 212; a signal transmission line 220 formed at a lower surface of the cap substrate 210; a ground line 230 formed at both sides of the signal transmission line 220; a connection pad 240 corresponding to the signal transmission line 220 and formed at an upper surface of the cap substrate 210 so as to be electrically connected to the signal transmission line 220 and the ground line 230 by the connection line 212; a bottom substrate 250 having a certain gap from the cap substrate 210; a piezoelectric capacitor 260 formed at one side of a suspension layer 251 formed at an upper surface of the bottom substrate 250 with a part of a first metal layer 261 being exposed, and actuated with a piezoelectric characteristic when an external power is applied thereto; and a capacitor contact electrode 270 formed at another side of the suspension layer 251 and connected to the exposed first metal layer 261, for selectively turning on/off an RF signal of the signal transmission line 220 by being moved up and down by a displacement of the piezoelectric capacitor 260.

The piezoelectric capacitor 260 is formed as a first metal layer 261, a dielectric layer 262, and a second metal layer 263 are sequentially deposited. A part of the first metal layer 261 is exposed to outside.

The capacitor contact electrode 270 preferably has a deposited structure composed of a first metal layer 271, a dielectric layer 272, and a second metal layer 273.

The capacitor contact electrode 270 has a basic structure of Ti/Au or Cr/Au for a low resistance and an excellent bonding with the suspension layer. In order to prevent a contact part between the contact electrode and the signal transmission line from being adhered to each other during an operation or in order to prevent a surface of the contact electrode from being damaged, Mo, W, and Ir for a high mechanical intensity and melting point can be thinly deposited.

That is, the capacitor contact electrode 270 preferably has one structure of Ti/Au/Mo, Cr/Au/Mo, Ti/Au/W, Cr/Au/W, Ti/Au/Ir, and Cr/Au/Ir.

The suspension layer 251 can be formed as a second suspension layer 253 of a silicon oxide is deposited on a first suspension layer 252 of a silicon nitride, as a second suspension layer 253 of a silicon oxide is deposited on a first suspension layer 252 of a silicon oxide, or as a second suspension layer 253 of a silicon nitride is deposited on a first suspension layer 252 of a silicon nitride.

Referring to FIG. 17, the second metal layer 272 of the capacitor contact electrode 270 is connected to the piezoelectric capacitor 260 by the first metal layer 261, thereby turning off the RF MEMS switch by flowing an RF signal to the ground line 230 when the capacitor contact electrode 270 is connected to the signal transmission line 220.

Figure 18:
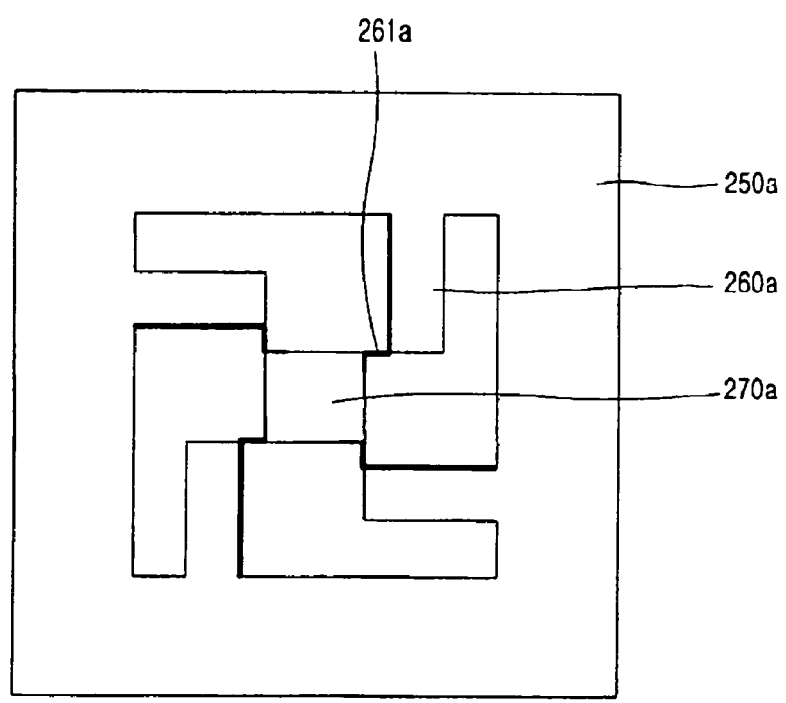
FIG. 18 is a plane view showing another example of the bottom substrate in the RF MEMS switch according to the second embodiment of the present invention.
Figure 19:
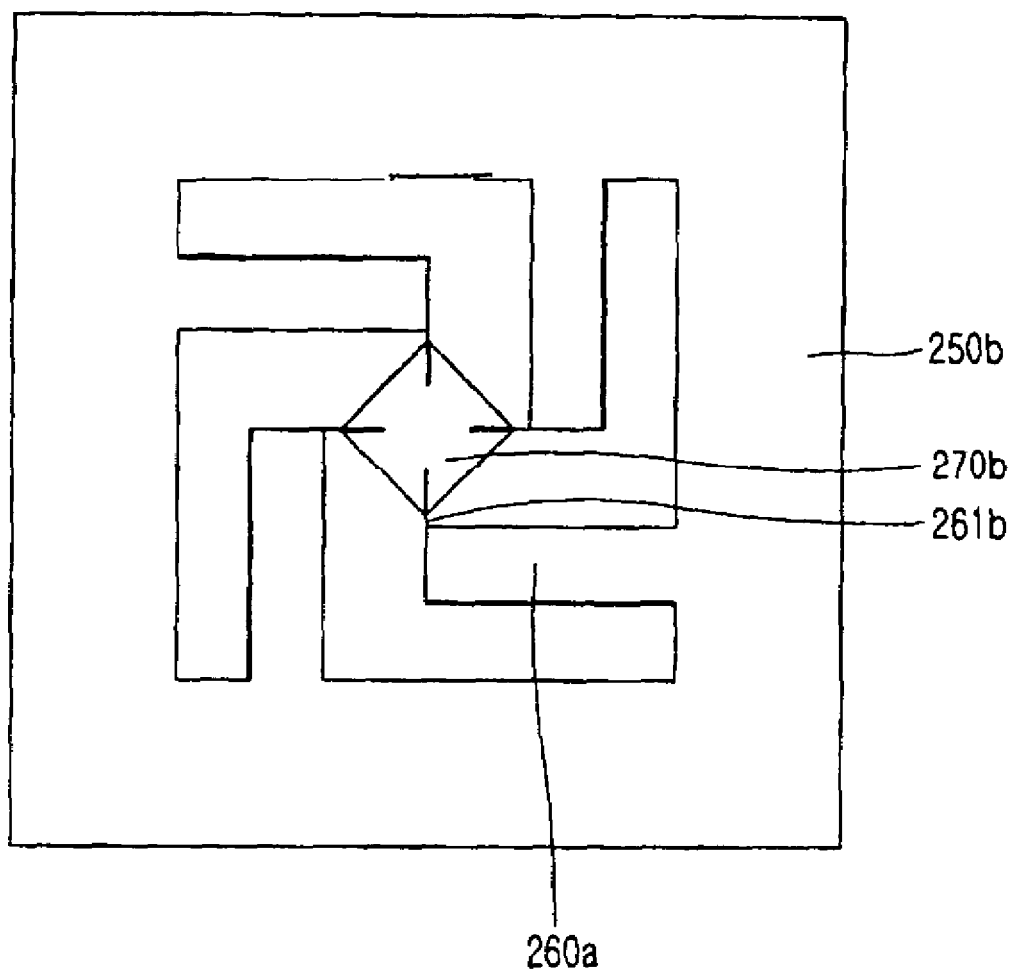
FIG. 19 is a plane view showing still another example of the bottom substrate in the RF MEMS switch according to the second embodiment of the present invention.

FIG. 18 is a plane view showing another example of the bottom substrate in the RF MEMS switch according to the second embodiment of the present invention, and FIG. 19 is a plane view showing still another example of the bottom substrate in the RF MEMS switch according to the second embodiment of the present invention.

As shown in FIG. 18, a second metal layer (not shown) of a square capacitor contact electrode 270a is connected to a piezoelectric capacitor 260a by a first metal layer 261a.

As shown in FIG. 19, a second metal layer (not shown) of a capacitor contact electrode 270b having a diamond shape is connected to a piezoelectric capacitor 260b by a first metal layer 261b.

In the RF MEMS switch 200 according to the second embodiment of the present invention, when power is supplied to the RF MEMS switch through the second metal layer 263, the suspension layer 251 that serves as a cantilever is deformed. At this time, the capacitor contact electrode 270 serves as a variable capacitor thereby to ground an RF signal flowing to the signal transmission line 220, thereby turning off the RF MEMS switch. On the contrary, when a power supply to the RF MEMS switch is cut off, the deformed suspension layer 251 is restored to the original state and thereby the RF MEMS switch is turned on.

FIGS. 20A to 20L are section views showing a fabrication process of the RF MEMS switch according to the second embodiment of the present invention.

According to a second embodiment of the present invention, there is also provided a fabrication method of an RF MEMS switch comprising: sequentially forming a first suspension layer of a silicon nitride and a second suspension layer of a silicon oxide on an upper surface of a bottom substrate, and forming a piezoelectric capacitor composed of a first electrode layer, a piezoelectric layer, and a second electrode at one side of an upper surface of the second suspension layer; patterning the second electrode layer and the piezoelectric layer and then etching so that a part of the first electrode layer can be exposed; forming a capacitor contact electrode at another side of the upper surface of the second suspension layer so that the exposed part of the first electrode layer can be covered; etching the first suspension layer and the second suspension layer of the rest region except the piezoelectric capacitor and the contact electrode; etching a part of the bottom substrate to release a gap between the first suspension layer and the bottom substrate, thereby completing the bottom substrate; etching a center part of a lower surface of a cap substrate to form a groove; forming via holes at both sides of the cap substrate and filling a metal in the via hole, thereby forming a connection line; forming a signal transmission line and a ground line at an upper surface of the cap substrate; forming a connection pad at the lower surface of the cap substrate; electrically connecting the signal transmission line and the ground line to the connection pad by the connection line, thereby completing the cap substrate; and bonding the cap substrate to the upper surface of the bottom substrate with a certain gap by using a bump.

Hereinafter, a fabrication method of an RF MEMS switch according to a second embodiment of the present invention will be explained with reference to FIGS. 20A to 20L.

Figure 20A:
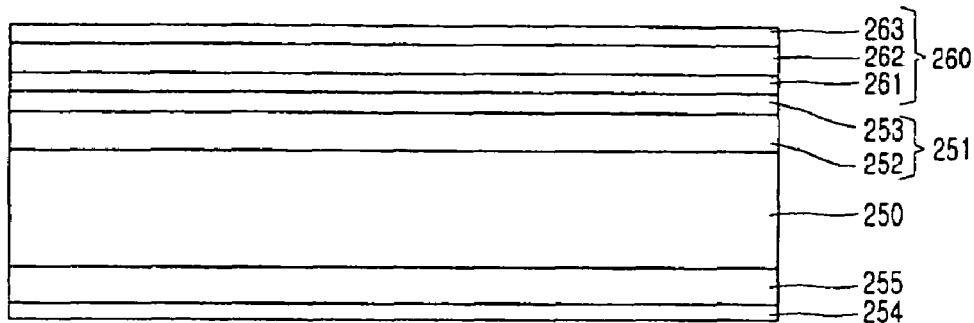
FIGS. 20A to 20L are section views showing a fabrication process of the RF MEMS switch according to the second embodiment of the present invention.

As shown in FIG. 20A, a first suspension layer 252 of a silicon nitride and a second suspension layer 253 of a silicon oxide are sequentially formed on an upper surface of a bottom substrate 250. Then, a piezoelectric capacitor 260 composed of a first electrode layer 261, a piezoelectric layer 262, and a second electrode layer 263 is formed at one side of an upper surface of the second suspension layer 253.

Figure 20B:
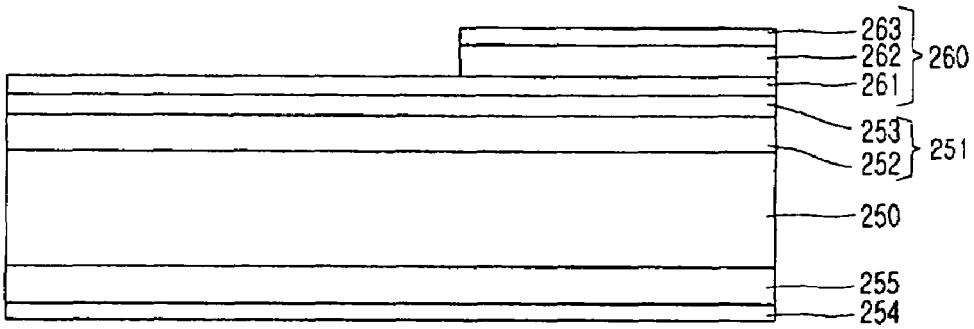
Figure 20C:
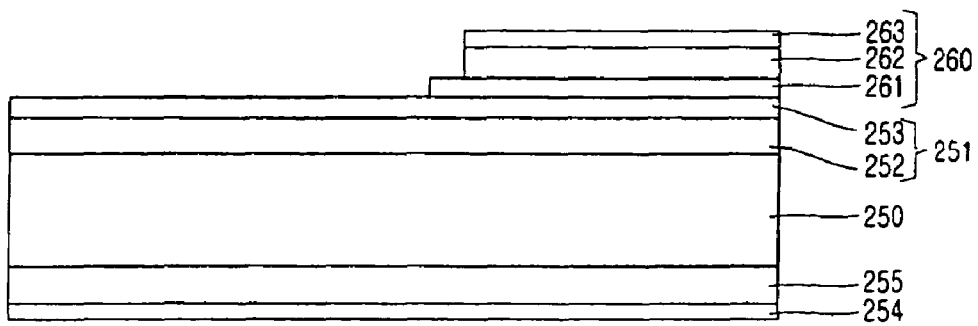

As shown in FIGS. 20B and 20C, the piezoelectric layer 262 and the second electrode layer 263 are patterned and then etched so that a part of the first electrode layer 261 can be exposed.

Figure 20D:
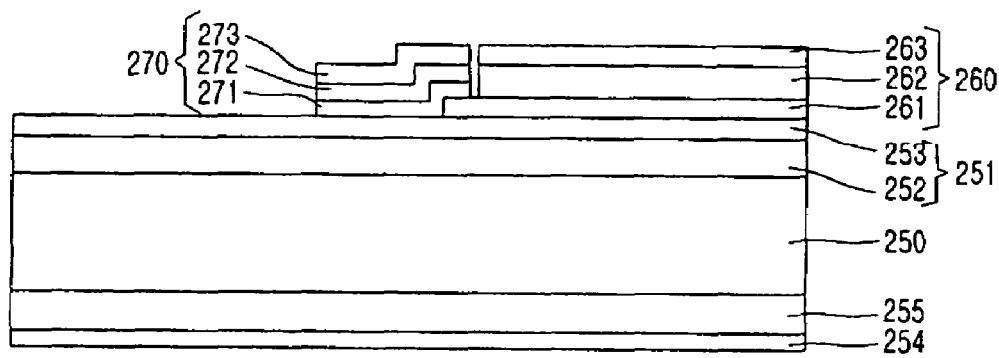

As shown in FIG. 20D, a capacitor contact electrode 270 is formed at another side of the upper surface of the second suspension layer 253 so that the exposed part of the first electrode layer 261 can be covered.

Figure 20E:
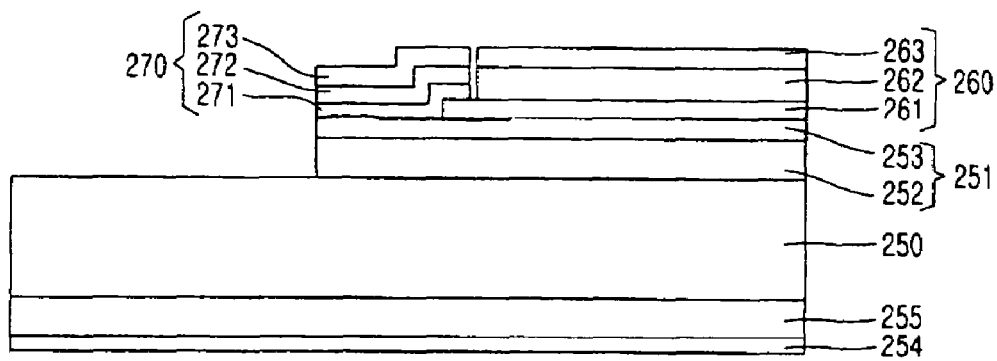

As shown in FIG. 20E, the first suspension layer 252 and the second suspension layer 253 of the rest region except the piezoelectric capacitor 260 and the capacitor contact electrode 270 are etched.

Figure 20F:
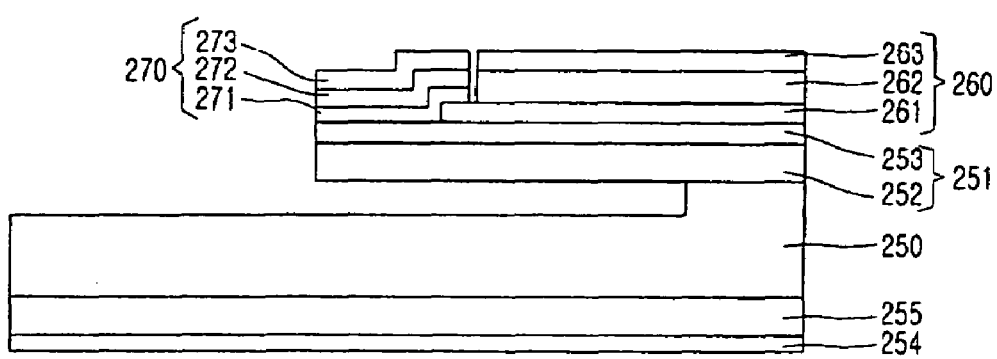

As shown in FIG. 20F, a part 257 of the bottom substrate 250 is etched to release a gap between the first suspension layer 252 and the bottom substrate 250, thereby completing the bottom substrate 250.

Figure 20G:
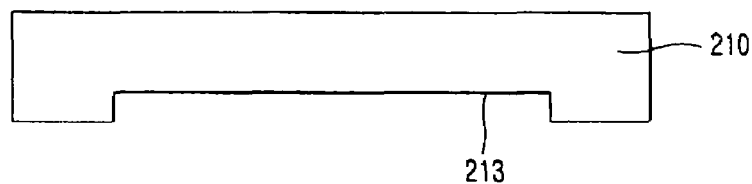

As shown in FIG. 20G, a center part of a lower surface of a mother substrate to be served as a cap substrate 210 is etched, thereby forming a groove 213.

Preferably, the groove of the cap substrate is formed by using one of a plasma dry etching method, a sand blaster, or a laser cutting method.

Figure 20H:
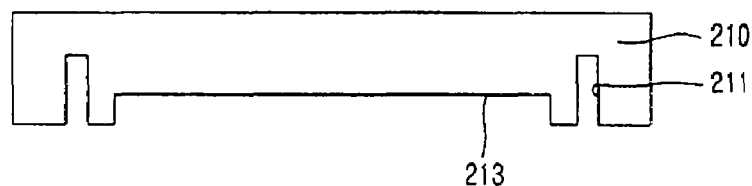
Figure 20I:
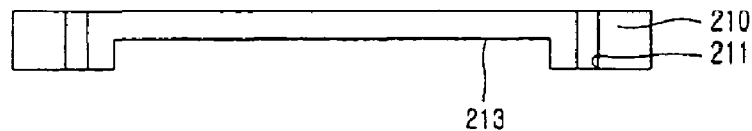
Figure 20J:
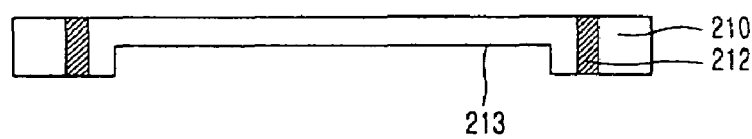

As shown in FIGS. 20H to 20J, a via hole 211 is formed at both sides of the cap substrate 210, and then a metal is filled in the via hole 211, thereby forming a connection line 212. The via hole 211 is formed by polishing the lower surface of the cap substrate 210 with a chemical mechanical polishing method.

Figure 20K:
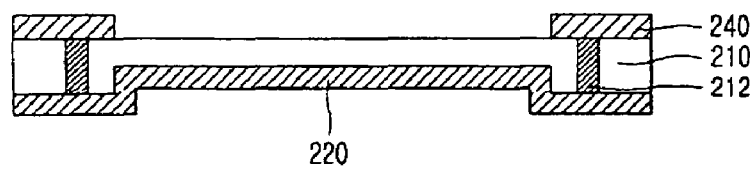

As shown in FIG. 20K, a signal transmission line 220, a ground line 230 (referring to FIG. 20L), and a connection pad 240 are formed on the lower surface of the cap substrate 210.

The signal transmission line 220 and the ground line 230 are electrically connected to the connection pad 240 by the connection line 212, thereby completing the cap substrate 210.

Figure 20L:
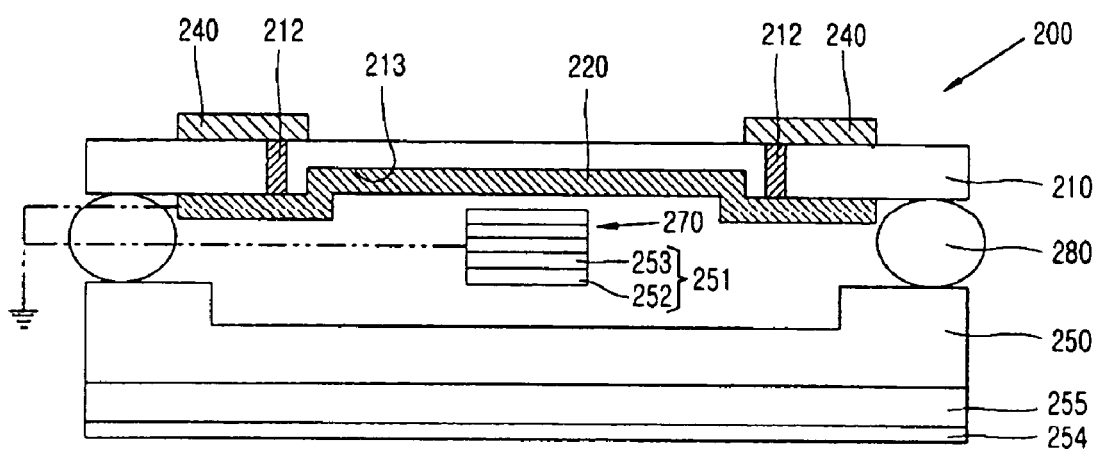

As shown in FIG. 20L, the cap substrate 210 is bonded to the upper surface of the bottom substrate 250 by using a bump 280, thereby completing the RF MEMS switch 200.

In the step for completing the bottom substrate 250 by etching the part 257 of the bottom substrate 250 and thereby releasing the gap between the first suspension layer 252 and the bottom substrate 250, a wet etching is preferably performed by using one of KOH, HNA, TMAH, EDP, NaOH, and $XeF_2$ gas phase.

Preferably, in the step for forming the groove of the cap substrate, one of a plasma dry etching method, a sand blaster, or a laser cutting method is preferably used.

In the step for forming via holes at both sides of the cap substrate and then filling a metal in the via hole thereby to form a connection line, the lower surface of the cap substrate is polished by using a chemical mechanical polishing method.

As aforementioned, the RF MEMS switch according to the present invention can be actuated with a low voltage and a low consumption power by using a piezoelectric capacitor, thereby having a high reliability and a high yield.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An RF MEMS switch, comprising:
a cap substrate;
a bottom substrate having a certain gap from the cap substrate;
a signal transmission line constituted with a single signal transmission line, and disposed at the cap substrate;
a connection line disposed at the cap substrate, and connected with the signal transmission line; and
an on/off means disposed at the bottom substrate, and turning on/off the signal transmission line for transmitting signal, wherein the on/off means comprises;
one or more piezoelectric capacitors disposed at the bottom substrate, and actuated with a piezoelectric characteristic by receiving an external power; and
a capacitor contact electrode connected with a first metal layer protruding from the piezoelectric capacitor,
wherein a ground line is formed adjacent to the signal transmission line and electrically connected to the signal transmission line by the connection line.

2. The RF MEMS switch of claim 1, wherein a solder bump is formed between the cap substrate and the bottom substrate in order to maintain a certain gap between the cap substrate and the bottom substrate.

3. The RF MEMS switch of claim 1, wherein an organic bump is formed between the cap substrate and the bottom substrate in order to maintain a certain gap between the cap substrate and the bottom substrate.

4. The RF MEMS switch of claim 1, wherein a groove is formed at a center part of the lower surface of the cap substrate.

5. The RF MEMS switch of claim 1 wherein the capacitor contact electrode has a deposited structure composed of a first metal layer, a dielectric layer and a second metal layer, and the piezoelectric capacitor is composed of a first metal layer, a piezoelectric layer and a second metal layer.

6. The RF MEMS switch of claim 1 wherein the signal transmission line is electrically connected to a connection pad by the connection line.

7. The RF MEMS switch of claim 1, wherein the first metal layer poisoned between the capacitor contact electrode and the piezoelectric capacitor has a width a narrower than a width of the other position.

8. The RF MEMS switch of claim 1 wherein the first metal layer positioned between the capacitor contact electrode and the piezoelectric capacitor is formed to have a wire type.

9. An RF MEMS switch, comprising:
a cap substrate;
a bottom substrate having a certain gap from the cap substrate;
a signal transmission line constituted with a single signal transmission line, and disposed at the cap substrate;
a connection line disposed at the cap substrate, and connected with the signal transmission line; and
an on/off means disposed at the bottom substrate, and turning on/off the signal transmission line for transmitting signal, wherein the on/off means comprises;
one or more suspension layers disposed at the bottom substrate;
one or more piezoelectric capacitors disposed at the suspension layers, and actuated with a piezoelectric characteristic by receiving an external power; and
a capacitor contact electrode disposed at the suspension layer, and connected with a first metal layer protruding from the piezoelectric capacitor,
wherein a ground line is formed adjacent to the signal transmission line and electrically connected to the signal transmission line by the connection line.

10. The RF MEMS switch of claim 9, wherein a solder bump is formed between the cap substrate and the bottom substrate in order to maintain a certain gap between the cap substrate and the bottom substrate.

11. The RF MEMS switch of claim 9 wherein an organic bump is formed between the cap substrate and the bottom substrate in order to maintain a certain gap between the cap substrate and the bottom substrate.

12. The RF MEMS switch of claim 9, wherein a groove is formed at a center part of the lower surface of the cap substrate.

13. The RF MEMS switch of claim 9 wherein the capacitor contact electrode has a deposited structure composed of a first metal layer, a dielectric layer and a second metal layer, and the piezoelectric capacitor is composed of a first metal layer, a piezoelectric layer and a second metal layer.

14. The RF MEMS switch of claim 9 wherein the signal transmission line is electrically connected to a connection pad by the connection line.

15. The RF MEMS switch of claim 9 wherein the capacitor contact electrode and the piezoelectric capacitor are formed on the same side of the suspension layer.

16. The RF MEMS switch of claim 9 wherein the capacitor contact electrode is connected to the piezoelectric capacitor by the first metal layer of the piezoelectric capacitor and/or the suspension layer.

17. The RF MEMS switch of claim 10 wherein the first metal layer of the piezoelectric capacitor and/or the suspension layer positioned between the capacitor contact electrode and the piezoelectric capacitor have a width narrower than a width of the other position.

18. The RF MEMS switch of claim 10 wherein the first metal layer of the piezoelectric capacitor and/or the suspension layer positioned between the capacitor contact electrode and the piezoelectric capacitor are formed to have a wire type.

19. An RF MEMS switch, comprising:
a signal transmission line having a first signal transmission line and a second signal transmission line electrically separated from each other for transmitting a signal; and
an on/off means for turning on/off the signal transmission line, wherein the on/off means comprises;
one or more suspension layers;
one or more piezoelectric capacitors disposed at the suspension layers, and actuated with a piezoelectric characteristic by receiving an external power; and
a contact electrode disposed at the suspension layers, and electrically separated from the piezoelectric capacitors,
wherein a ground line is formed adjacent to the signal transmission line and electrically connected to the signal transmission line by a connection line.

20. The RF MEMS switch of claim 19 wherein the suspension layer positioned between the contact electrode and the piezoelectric capacitor is formed to have a wire type.

21. The RF MEMS switch of claim 19, wherein the signal transmission line further comprises a connection pad.

22. The RF MEMS switch of claim 21, wherein the signal transmission line is electrically connected to the connection pad by a connection line.

23. The RF MEMS switch of claim of claim 21, wherein the contact electrode has one structure of Ti/Au/Mo, Cr/Au/Mo, Ti/Au/W, Cr/Au/W, Ti/Au/Ir and Cr/Au/Ir.

24. The RF MEMS switch of claim 19 the piezoelectric capacitor is composed of a first metal layer, a piezoelectric layer and a second metal layer, and the piezoelectric layer is formed of Pb(Zr, Ti).

25. The RF MEMS switch of claim 24, wherein a ratio between the Zr and Ti is 6:4.

26. The RF MEMS switch of claim 19, wherein the contact electrode has a square shape or a diamond shape.

27. The RF MEMS switch of claim 19, wherein the contact electrode and the piezoelectric capacitor are formed on the same side of the suspension layer.

28. The RF MEMS switch of claim 19, wherein the contact electrode is connected to the piezoelectric capacitor by the suspension layer.

29. The RF MEMS switch of claim 19 wherein the suspension layer positioned between the contact electrode and the piezoelectric capacitor has a width narrower than a wide of the other position.

30. An RF MEMS switch, comprising:
a signal transmission line constituted with a single signal transmission line for transmitting a signal; and
an on/off means for turning on/off the signal transmission line, wherein the on/off means comprises;
one or more piezoelectric capacitors actuated with a piezoelectric characteristic by receiving an external power; and
a capacitor contact electrode connected with a first metal layer protruding from the piezoelectric capacitor,
wherein a ground line is formed adjacent to the transmission line and electrically connected to the transmission line by a connection line.

31. The RF MEMS switch of claim 30, wherein the capacitor contact electrode is connected to the piezoelectric capacitor by the first metal layer of the piezoelectric capacitor.

32. The RF MEMS switch of claim 30 wherein the capacitor contact electrode has a deposited structure composed of a first metal layer, a dielectric layer and a second metal layer.

33. The RF MEMS switch of claim 30, wherein the capacitor contact electrode has one structure of Ti/Au/Mo, Cr/Au/Mo, Ti/Au/W, Cr/Au/W, Ti/Au/Ir and Cr/Au/Ir.

34. The RF MEMS switch of claim 30 wherein the first metal layer poisoned between the capacitor contact electrode and the piezoelectric capacitor has a width a narrower than a width of the other position.

35. The RF MEMS switch of claim 30, wherein the first metal layer positioned between the capacitor contact electrode and the piezoelectric capacitor is formed to have a wire type.

36. The RF MEMS switch of claim 30 wherein the signal transmission line further comprises a connection pad.

37. The RF MEMS switch of claim 36, wherein the signal transmission line is electrically connected to the connection pad by a connection line.

38. The RF MEMS switch of claim 30, wherein the piezoelectric capacitor is composed of a first metal layer, a piezoelectric layer and a second metal layer, and the piezoelectric layer is formed of Pb(Zr, Ti).

39. The RF MEMS switch of claim 38, wherein a ratio between the Zr and Ti is 6:4.

40. The RF MEMS switch of claim 30, wherein the capacitor contact electrode has a square shape or a diamond shape.

41. An RF MEMS switch comprising:
a signal transmission line constituted with a single signal transmission line for transmitting a signal; and
an on/off means for turning on/off the signal transmission line for transmitting signal, wherein the on/off means comprise;
one or more suspension layers;
one or more piezoelectric capacitors disposed at the suspension layers, and actuated with a piezoelectric characteristic by receiving an external power; and
a capacitor contact electrode disposed at the suspension layers, and connected with a first metal layer protruding from the piezoelectric capacitor,
wherein a ground line is formed adjacent to the transmission line and electrically connected to the transmission line by the connection line.

42. The RF MEMS switch of claim 41, wherein the contact capacitor electrode has a square shape or a diamond shape.

43. The RF MEMS switch of claim 41, wherein the capacitor contact electrode and the piezoelectric capacitor are formed on the same side of the suspension layer.

44. The RF MEMS switch of claim 41, wherein the capacitor contact electrode is connected to the piezoelectric capacitor by the first metal layer of the piezoelectric capacitor and/or the suspension layer.

45. The RF MEMS switch of claim 41 wherein the first metal layer of the piezoelectric capacitor and/or the suspension layer positioned between the capacitor contact electrode and the piezoelectric capacitor have a width narrower than a width of the other position.

46. The RF MEMS switch of claim 41, wherein the signal transmission line further comprises a connection pad.

47. The RF MEMS switch of claim 46 wherein the signal transmission line is electrically connected to the connection pad by a connection line.

48. The RF MEMS switch of claim 47 wherein the capacitor contact electrode has one structure of Ti/Au/Mo, Cr/Au/Mo, Ti/Au/W, Cr/Au/W, Ti/Au/Ir and Cr/Au/Ir.

49. The RF MEMS switch of claim 41 wherein the capacitor contact electrode has a deposited structure composed of a first metal layer, a dielectric layer and a second metal layer, and the piezoelectric capacitor is composed of a first metal layer, a piezoelectric layer and a second metal layer.

50. The RF MEMS switch of claim 49 wherein the first metal layer of the piezoelectric capacitor and/or the suspension layer positioned between the capacitor contact electrode and the piezoelectric capacitor are formed to have a wire type.

51. The RF MEMS switch of claim 49 wherein the piezoelectric layer is formed of Pb(Zr, Ti).

52. The RF MEMS switch of claim 51, wherein a ratio between the Zr and Ti is 6:4.

53. An RF MEMS switch, comprising:
a cap substrate;
a bottom substrate having a certain gap from the cap substrate;
a signal transmission line having a first signal transmission line and a second signal transmission line electrically separated from each other for transmitting a signal, and disposed at the cap substrate;
a connection line disposed at the cap substrate, and connected with the signal transmission line; and
an on/off means disposed at the bottom substrate, and turning on/off the signal transmission line for transmitting signal, wherein the on/off means comprises;
one or more suspension layers disposed at the a bottom substrate;
one or more piezoelectric capacitors disposed at the suspension layers, and actuated with a piezoelectric characteristic by receiving an external power; and a contact electrode disposed at the suspension layers, and electrically separated from the piezoelectric capacitors,
wherein a ground line is formed adjacent to the signal transmission line and electrically connected to the signal transmission line by the connection line.

54. The RF MEMS switch of claim 53 wherein the signal transmission line is electrically connected to the connection pad by the connection line.

55. The RF MEMS switch of claim 53 wherein the contact electrode and the piezoelectric capacitor are formed on the same side of the suspension layer.

56. The RF MEMS switch of claim 53 wherein the contact electrode is connected to the piezoelectric capacitor by the suspension layer.

57. The RF MEMS switch of claim 53, wherein the suspension layer positioned between the contact electrode and the piezoelectric capacitor has a width narrower than a wide of the other position.

58. The RF MEMS switch of claim 53 wherein the suspension layer positioned between the contact electrode and the piezoelectric capacitor is formed to have a wire type.

59. The RF MEMS switch of claim 53, wherein the connection line is exposed to outside through a via hole of the cap substrate.

60. The RF MEMS switch of claim 53, wherein a solder bump is formed between the cap substrate and the bottom substrate in order to maintain a certain gap between the cap substrate and the bottom substrate.

61. The RF MEMS switch of claim 53 wherein an organic bump is formed between the cap substrate and the bottom substrate in order to maintain a certain gap between the cap substrate and the bottom substrate.

62. The RF MEMS switch of claim 53, wherein a groove is formed at a center part of the lower surface of the cap substrate.

* * * * *